Dec. 24, 1957 R. P. DECKER 2,817,719

U. H. F. LOW NOISE AMPLIFIER

Filed Dec. 30, 1955 3 Sheets-Sheet 1

INVENTOR
RAMSAY P. DECKER
BY Moody and Goldman
ATTORNEYS

Dec. 24, 1957 R. P. DECKER 2,817,719

U. H. F. LOW NOISE AMPLIFIER

Filed Dec. 30, 1955 3 Sheets-Sheet 2

INVENTOR
RAMSAY P. DECKER
BY Moody and Goldman
ATTORNEYS

INVENTOR.
RAMSAY P. DECKER
BY Moody and Goldman
ATTORNEYS

United States Patent Office 2,817,719

Patented Dec. 24, 1957

2,817,719

U. H. F. LOW NOISE AMPLIFIER

Ramsay P. Decker, Cedar Rapids, Iowa, assignor to Collins Radio Company, Cedar Rapids, Iowa, a corporation of Iowa Application December 30, 1955, Serial No. 556,681

13 Claims. (Cl. 179—171)

This invention relates to an ultra-high-frequency amplifier which is capable of having a very low noise-figure and can have narrow-band selectivity.

The noise-figure of a particular amplifier is defined as its input signal-to-noise power ratio divided by its output signal-to-noise power ratio. Therefore, the minimum and best noise-figure that an amplifier can have is one; since, in such case, the output signal-to-noise ratio is the same as the input signal-to-noise ratio, and hence is not increased by noise internally generated in the amplifier.

The invention concerns a particular transmission-line arrangement which provides mismatching for the best noise-figure of an amplifier, having a grounded-cathode stage followed by a grounded-grid stage. A mismatching line of strip construction is provided by the invention, and can obtain the critical mismatching requirements at ultra-high frequencies with relative ease, while permitting very little transmission power loss.

Conventionally, lumped-constant amplifiers, having a ground-cathode stage followed by a grounded-grid stage, are used in the VHF region below about 300 megacycles. However, such amplifiers have been considered impractical for use at frequencies above about 300 megacycles because of a number of factors, such as: their increasing instability as the frequency is increased, difficulties in neutralizing interelectrode capacitances, and difficulties in obtaining cancellation of stray susceptances at the higher frequencies.

Accordingly, in the ultra-high frequencies, grounded-grid amplifiers have been almost solely used primarily because they are easier to stabilize at ultra-high frequencies, and, therefore, are less likely to have parasitic regeneration than previously used grounded-cathode amplifiers.

However, this invention provides an amplifier having a grounded-cathode first stage; which, at U. H. F. frequencies such as 1000 megacycles-per-second, can provide a noise-figure that is lower than the noise-figure provided by the same tube when connected as a conventional grounded-grid circuit and can be, for example, approximately 5.9 decibels, and is stable at U. H. F. frequencies.

This invention overcomes the previous U. H. F. disadvantages of ground-cathode amplifiers, and permits basic differences between the grounded-cathode circuit and the grounded-grid circuit to be utilized at ultra-high frequencies. One basic difference is that the former has a much higher input impedance than the latter. This permits the grounded-cathode amplifier to have better selectivity than the grounded-grid amplifier, if means can be provided to overcome difficulties inherent in grounded-cathode operation at ultra-high frequencies, which is accomplished by this invention. Thus, for example, this invention can provide grounded-cathode arrangements that obtain an input bandwidth that may be a fraction of the bandwidth permitted by comparable grounded-grid arrangements.

Another basic advantage of the grounded-cathode circuit over the grounded-grid circuit is that the former is capable of higher actual gain. In the past, nevertheless, the gain advantages of the grounded-cathode have not been able to be realized in practice because of the instability that accompanied increased gain. However, this invention permits, at ultra-high frequencies, a grounded-cathode stage to be loaded by the low impedance input of a grounded-grid stage, thus obtaining a combination of gain and stability heretofore unobtainable at ultra-high frequencies.

Another basic advantage of the grounded-cathode amplifier over the grounded-grid amplifier is that the noise-figure of the latter is critically dependent on its output circuit losses, which is not the case with the grounded-cathode circuit. This invention also permits this advantage to be realized at ultra-high frequencies.

The invention can obtain the best noise-figure available for a given type of amplifier tube; but it is generally desired that the tube chosen for the grounded-cathode stage be capable of providing a minimum noise-figure. In general, these tube characteristics are: (1) generation of a minimum amount of internal noise, and (2) a minimum overall input conductance, which includes transit-time loading effects. One suitable tube type is generally designated in the electronics industry as a 6280/416B planar-type triode.

The second tube in the invention, which provides a grounded-grid stage, may have a somewhat higher level of internal noise without substantially increasing the noise-figure of the amplifier and might, for example, be a "pencil" triode.

The primary object of this invention is, therefore, to provide an amplifier that has a noise-figure in the ultra-high frequency region that is superior to that obtainable by presently known amplifiers.

It is another object of this invention to provide a low-noise amplifier for the U. H. F. region that is relatively easy to construct and adjust.

It is still another object of this invention to provide a low-noise amplifier for the U. H. F. region that is capable of having much better input selectivity than conventional grounded-grid amplifiers operated in the same frequency region.

The invention features strip-type of transmission lines as the interconnecting and tuning medium of the amplifier, wherein a common ground-plane serves as one side of each line and a single conductor serves as the other side.

The characteristic impedance of the transmission lines in the invention should be closely controlled. This can easily be done by adjusting the spacing and/or dielectric material used with the strip-type of line. Since one side of the line is a common ground-plane, only a single strip of metal, comprising the other side, need be manipulated.

The invention provides mismatching features for some of its transmission lines utilizing susceptance-cancelling tuning stubs. A first line is between the amplifier input terminals and the input to the grounded-cathode stage and has a stub at each end. The line and tuning stubs have a predetermined characteristic impedance chosen, as will be described below, to permit the input of the grounded-cathode stage to see the mismatch which provides an optimum noise-figure.

In a like manner, another line having susceptance-cancelling stubs at both ends is provided between the output of the grounded-cathode stage and the input to the grounded-grid stage. By proper choice of transmission line parameters and stubs, as taught herein, the grounded-cathode stage can see an output impedance which provides stable operation and the grounded-grid stage can see substantially an optimum source impedance, which provides optimum noise characteristics.

Another stub is provided between the grid and plate electrodes of the grounded-cathode stage to neutralize its grid-to-plate interelectrode capacitance; and a stub is provided at the output of the grounded-grid stage to match (or mismatch, depending on the particular case) it to a load, which is connected to the output of the invention.

Further advantages, objects and features of this invention will be apparent to a person skilled in the art upon further study of this specification and drawings, in which.

Figure 3:
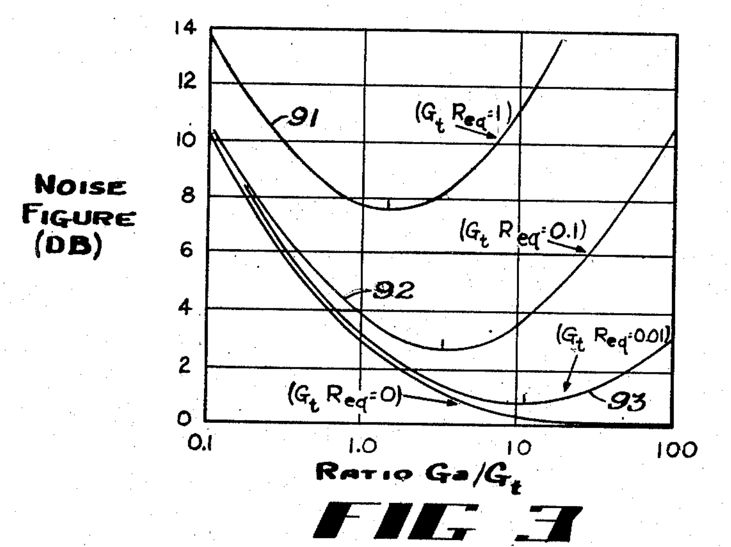
Figure 4:
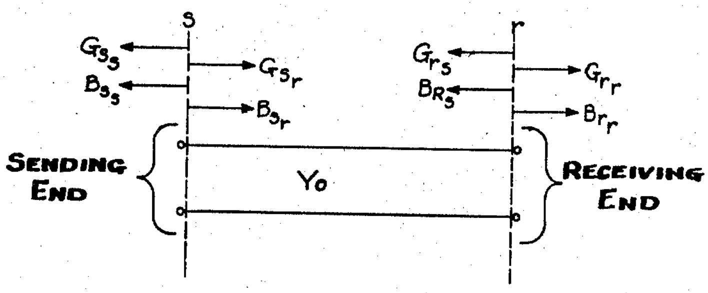

Figure 3 provides a set of curves that illustrate the relationship between input impedance mismatch and amplifier noise-figure; and, Figure 4 is used to explain transmission-line theory utilized in this invention.

Figure 1:
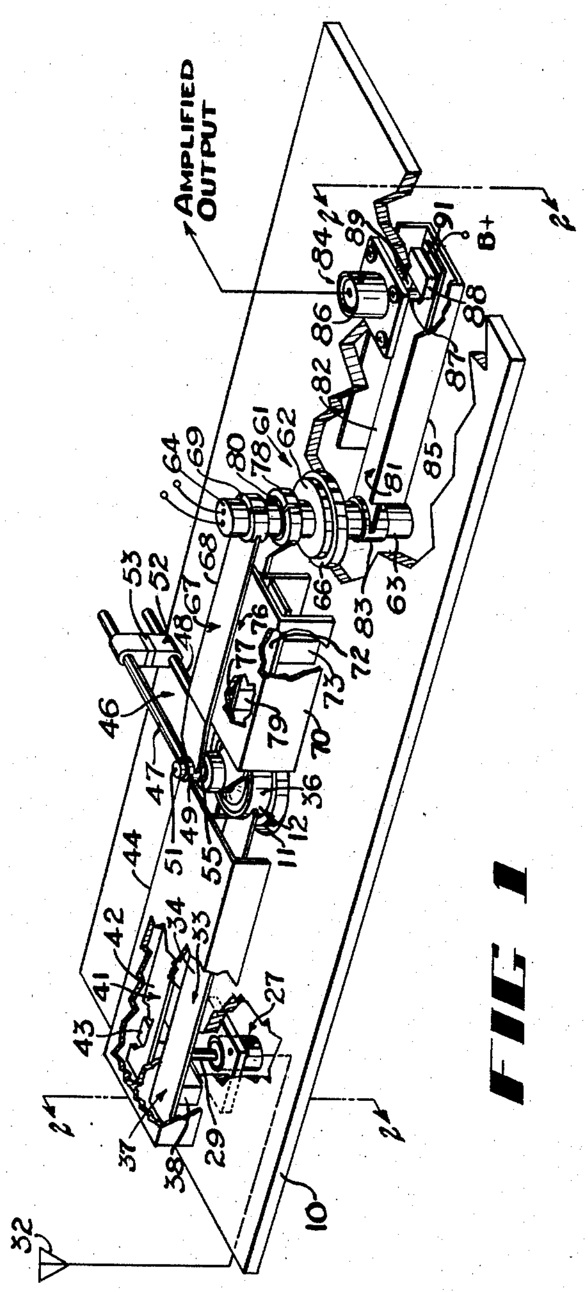
Figure 1 is a perspective view with several cut-away portions to illustrate one form of the invention.

Now referring to the invention in more detail, Figure 1 shows the invention assembled about a metallic ground-plane 10. A first opening 11 is formed in ground-plane 10; and a tube 12, which might for example, be a planar type, designated in the industry as 416B, is supported in opening 11 by a tube support 13, best shown in Figure 2.

Tube support 13 includes a cylindrical-shaped well 14, made of insulating material, which has flange 16 that may be fastened to ground-plane 10 by means of bolts, for example.

A plurality of contact fingers 17 made of a conducting material are supported inside of well 13, and project inwardly to contact the cathode-contacting surface 18 of tube 12. A tube socket 19, similar to many common available types having pin connections, is fastened by bolts to the bottom of well 14.

Only the filament power and direct-current connections to tube 12 connect to the pins of socket 19. Tube 12 is insulated direct-current wise from ground-plane 10 in order to utilize a cathode-biasing resistor 21 which connects between ground-plane 10 and socket-pin 22 that is connected to the tube cathode. However, in the case of some tubes, such as the 416B, which have a bypass capacitor built into them, well 14 may be made of conducting material to thus connect cathode surface 18 to ground. Many tubes do not have a built-in bypass capacitor, and the support provided here for tube 12 may be used in either case.

Contact fingers 17 have a relatively large area spaced closely to ground-plane 10 to provide a virtually zero impedance between the cathode and ground at the ultra-high frequencies pertaining to the invention to thus ground the cathode of tube 12. A pair of pins 24 and 26 connect to a filament voltage supply to provide the necessary heater voltage.

The radio-frequency input to the amplifier is received at a coaxial coupler 27, which has its outer conductor 28 fastened to ground-plane 10; and an inner conductor 29 is supported therein by a dielectric spacer 31. An antenna 32 might, for example, be connected by a coaxial cable to coupler 27.

A mismatching transmission line 33 connects between coaxial coupler 28 and the input of grounded-cathode tube 12. Mismatching line 33 is comprised of ground-plane 10 and a single flat strip 34 of conducting material with a spacing between them that obtains a required characteristic impedance, as will be explained below.

The inner conductor 29 of coaxial connector 27 connects to strip 34 at a substantial distance from either of its ends. One end of strip 34 is fixed to a split-ring 36 which engages the control-grid-contacting surface of tube 12, and thereby connects, radio-frequency wise, between the grounded cathode and the control-grid of tube 12. The opposite end of strip 34 is a reactance-cancelling stub 37 which has a metallic block 38 received as a short-circuit between strip 34 and ground-plane 10. Block 38 may be slideable to provide an adjustable reactance.

A second reactance-cancelling stub 41 is provided at the tube end of line 33 and comprises a metallic strip 42, that also is fixed at one end to grid-contact ring 36, and a shorting block 43 between its other end and ground-plane 10. Block 43 may be slideable to provide a reactance adjustment for stub 41. Hence, stub 41 may be used to cancel the susceptance at the input of tube 12, which is between its grid and cathode. The susceptance cancellation by stubs 33 and 41 is used to obtain required mismatching conditions, which will be explained below.

Figure 2:
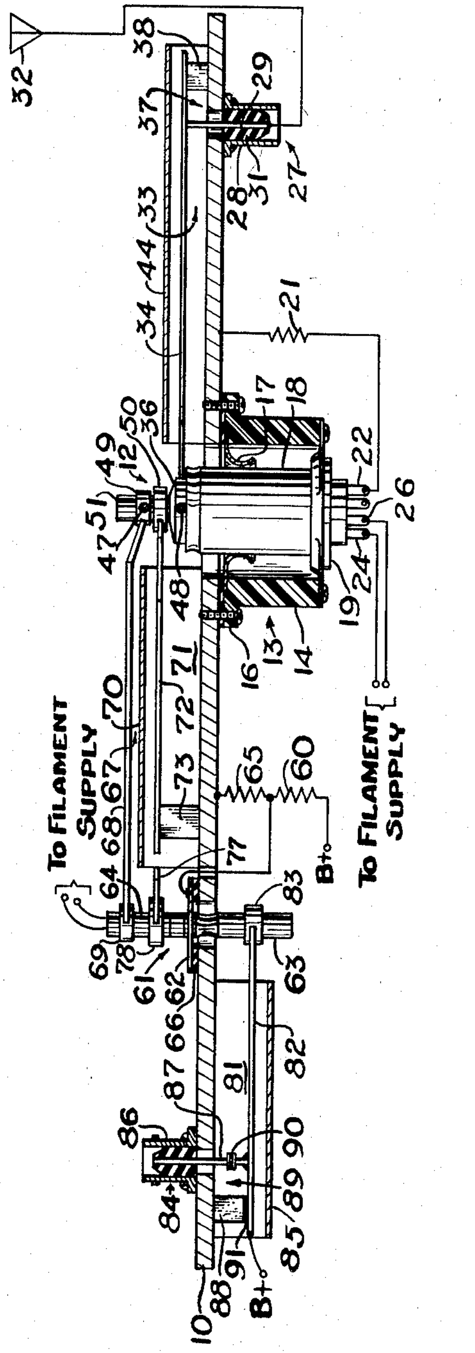
Figure 2 is a sectional view taken along plane 2—2—2—2 in Figure 1.

A shield 44, which has an E-shaped cross-section, may surround ungrounded strips 34 and 42 to prevent stray coupling. A neutralizing stub 46 is comprised of rods 47 and 48 shown in Figure 1. Upper rod 47 connects at one end to a contact ring 49, which engages the plate-contacting surface 51 of tube 12; and lower rod 48 connects at one end to grid-contact ring 36, as shown in Figure 2. A radio-frequency shorting bar 52 is slideably received over rods 47 and 48, and a thin dielectric spacer 53 separates opposite parts of shorting bar 52 to provide direct-current insulation between rods 47 and 48, although the capacitance across dielectric spacer 53 provides a virtual short circuit at ultra-high frequencies. Stub 46 is adjusted to resonate with the grid-to-plate interelectrode capacitance of tube 12 and, therefore, neutralizes this capacitance by making the grid-to-plate impedance appear as a very large resistance.

A second tube 61 is provided, which might be a type of triode electron tube generally known as a pencil triode. Tube 61 has: an intermediate-flange member 62 which connects to the tube's control grid, a cylindrical-plate-contacting surface 63 at its lower end in Figure 2, and a cylindrical-cathode-contacting surface 64 at its upper end in Figure 2. Filament leads extend from the end of cathode-contact surface 64. The grid of tube 61 is biased by means of a voltage divider comprising resistors 60 and 65, with a lead connecting their intermediate point to grid flange 62.

An annular dielectric member 66 is received between ground-plane 10 and grid-contacting surface 62; and they may be cemented together to support pencil triode 61 in an insulated manner from ground-plane 10. Therefore, the control grid will not be at ground-potential direct-current wise; although the capacitance between grid flange 62 and ground-plane 10 is large enough to provide virtually zero conductance between the ground-plane and grid at the ultra-high frequencies used with this invention. As a result, grid 62 is grounded radio-frequency wise, and tube 61 operates as a grounded-grid stage.

A transmission line 67 includes a metallic strip 68 that connects between the plate of planar tube 12 and the cathode of pencil triode 61. The other side of line 67 is primarily the grounded-surface of an E-shaped shield 70. Metallic strip 68 connects at one end to plate-contact ring 49, which engages the plate of planar tube 12, and connects at its other end to a cathode-contact ring 69, which engages cathode-contacting surface 64 of pencil triode 61. Also, strip 68 connects the plate of tube 12 in series with the B-plus supply voltage through the direct-current plate impedance of tube 61.

A reactance-cancelling stub is provided at each end of transmission line 67. One stub 71 is provided by a strip 72 which connects at one end to a plate-contact ring 50; and an adjustable shorting block 73 is received between strip 72 and ground-plane 10. Contact ring 50 is split on one side and is insulated direct-current wise from plate-surface 51 by an insulating ring 55, although the capacitance across ring 55 provides a short circuit to U. H. F. currents.

In a similar manner, another stub 76 is provided by another strip 77 which is connected at one end to a cathode-contact ring 78; and another shorting block 79 is adjustably received between strip 77 and ground-plane 10. Contacting ring 78 is split on one side and is insulated direct-current wise from cathode-surface 64 by an insulating ring 80, although the capacitance across ring 80 provides a short circuit to U. H. F. currents.

Stubs 71 and 76 are surrounded by E-shaped shield 70 to prevent stray coupling.

Stub 71 is used to cancel the net susceptance at one end of transmission line 67, and the other stub 76 is used to cancel the net susceptance at the other end of transmission line 67, in order to provide a required set of mismatch conditions, as will be explained in detail below.

The output of second tube 61 is removed by means of still another strip-type transmission line 81 that includes the ground-plane and a strip 82, which connects at one end to an annular contact ring 83 received about the plate-contacting surface 63 of pencil triode 61. An output coaxial connector 84 has an outer conductor 86 fastened to ground-plane 10 and an inner conductor 87 fastened to strip 82. Connector 84 receives an outgoing coaxial transmission line (not shown) which might connect to a following amplifier or frequency mixer stage. A capacitor 90 is serially connected to inner conductor 87 and blocks direct-current but provides almost no impedance to ultra-high frequency currents.

A shorting slug 88 is received between the opposite end of strip 82 and ground-plane 10 to make the portion of the line between connector 84 and slug 88 a reactance-controlling stub 89 for matching the output of the amplifier to a load. Slug 88 has a thin dielectric portion 91 that insulates strip 82 from ground-plane 10 direct-current wise while permitting a virtual short circuit at ultra-high frequencies. A shield 85 surrounds strip 82.

It is necessary to understand some basic amplifier noise theory in order to understand this invention. The noise-figure of a given amplifier is primarily dependent upon the equivalent noise resistance, $R_{eq}$, of the amplifier, the input transit time loading conductance, $G_t$, of the amplifier, the input loss conductance $G_l$ of the amplifier, and the source impedance, $G_a$, connected to the amplifier input.

An equivalent noise resistance, $R_{eq}$, is a tool for evaluating the noise generated in a given amplifier, and may be defined with respect to an ideal noiseless amplifier, having the same gain as the given amplifier, as: that value of resistance which must be connected to the input of the ideal amplifier to provide an output noise current that is equal to the noise current generated in the output of the given amplifier.

As stated above, the best noise-figure for an amplifier is not generally obtained with a matched condition between the input impedance of the amplifier and the source impedance. On the other hand, the noise-figure may be best with a particular unmatched input conductance ratio $G_a/G_{in}$ and may be determined by the minimum point on a curve in Figure 3, such as one of curves 91, 92 and 93 or a curve (not shown) which is between them. In Figure 3, the ratio $G_a/G_t$ assumes that $G_l$ is negligibly small at the ultra-high frequencies involved herein. It is emphasized that only for ultra-high frequency grounded-cathode amplifiers is the optimum ratio $G_a/G_t$ equal very nearly to the optimum mismatch ratio $G_a/G_{in}$ at the input to the amplifier tube.

The product, $G_tR_{eq}$, is a parameter fixed by the choice of a given amplifier tube and is important in evaluating amplifier tubes for use in low noise applications. It is noted that the optimum noise-figure (which is the minimum point on each of the curves) improves as the product, $G_tR_{eq}$, becomes smaller. And it is further noted that the optimum noise-figure becomes better as the required mismatch becomes greater.

Although the noise-figure of the amplifier depends primarily on the product. $G_tR_{eq}$, and the input mismatch, the selectivity of the amplifier depends primarily on its input conductance $G_{in}$. In the case of the grounded-cathode amplifier, the input conductance, $G_{in}$, is approximately equal to the transit-time conductance, $G_t$. However, in the case of the grounded-grid amplifier, the input conductance, $G_{in}$, is larger and is equal to $$G_t+\frac{g_m}{1+\frac{R_p}{r_p}}$$

where $g_m$ is the mutual conductance of the tube, $R_p$ is the plate load source resistance, and $r_p$ is the plate resistance of the tube, all at the given operating frequency.

Thus, where a low-noise narrow-band amplifier is required, not only should the chosen tube have a minimum product, $G_tR_{eq}$; but the value of $G_t$ should also be minimum, in a choice between tubes having the same product but different values of input conductance.

In the U. H. F. band, the optimum noise-figure, $F_{opt.}$, may be approximately determined (when the product, $G_tR_{eq}$, is much less than one) by the formula:

$$F_{opt.}\approx 1+2\sqrt{5R_{eq}G_t} \quad (1)$$

And the optimum conductance ratio $$\left(\frac{G_a}{G_t}\right)_{opt.}$$

for best noise-figure may be determined approximately (when the product, $R_{eq}G_t$, is much less than one) by the formula:

$$\left(\frac{G_a}{G_t}\right)_{opt.}=\frac{1}{\sqrt{5G_tR_{eq}}} \quad (2)$$

Formula 2 may be solved to determine the optimum source conductance at the input to a grounded-cathode amplifier, as follows:

$$(G_a)_{opt.}=\sqrt{\frac{5G_t}{R_{eq}}} \quad (3)$$

wherein $(G_a)_{opt.}$ is that source conductance which must appear at the amplifier tube input to provide the best noise-figure.

It can further be shown that the transit time loading conductance $G_t$ of a tube increases approximately with the square of the frequency; and the optimum noise-figure decreases accordingly with frequency.

This mismatching requirements of this invention are obtained in proportioning its various transmission line components. It will be realized that problems occurring in providing mismatched conditions with a distributed-constant circuit are substantially different from those occurring in lump-constant circuits; and this invention shows how the mismatched conditions can be obtained using distributed-constant circuits.

A theory for mismatching the terminals of a distributed-constant transmission line may be stated as follows: Where opposite ends of a transmission line are terminated in unequal and unmatched conductances, wherein there is zero susceptance at both ends of the line, the ratio of connected sending end conductance to sending end source conductance is equal to the ration of connected receiving end conductance to receiving end source conductance.

The theory may be explained in more detail using Figure 4, which shows a section of transmission line having a characteristic admittance, $Y_0$. Sending-end conductances are taken along a plane $s$, situated at the sending-end terminals; and receiving-end conductances are taken along another plane $r$, situated at the receiving-end terminals. Also, the net susceptances at both the receiving and sending ends are zero; and the end admittances are, therefore, pure conductances, which are taken at each plane in opposite directions along the line.

Conductances $G_{s_r}$ and $G_{s_s}$ are taken at plane $s$; where $G_{s_r}$ is the sending-end source conductance, looking at the load end of the line; and $G_{s_s}$ is the sending-end conductance, looking at a sending end connected impedance, Conductances $G_{r_r}$ and $G_{r_s}$ are taken at plane $r$; where $G_{r_r}$ is the load-end conductance, looking at a load end connected impedance, and $G_{r_s}$ is the load-end source conductance, looking toward the sending end of the line. These actual and source conductances are related by the above theorem as given in the following expression:

$$\frac{G_{r_s}}{G_{r_r}}=\frac{G_{s_r}}{G_{s_s}} \quad (4)$$

Furthermore, the conductances appearing across planes $s$ and $r$ are related to the characteristic admittance, $Y_0$, (reciprocal of characteristic impedance) of line by the following formula:

$$Y_0=\sqrt{G_{r_s}G_{s_s}-B_{r_r}^2}=\sqrt{G_{s_r}G_{r_r}-B_{s_s}^2} \quad (5)$$

where $Y_0$ is the characteristic admittance of the transmission line between planes $s$ and $r$, $B_{ss}$ is the magnitude of a susceptance connected to the sending end of the line to provide at the receiving end a source susceptance that cancels the receiving-end susceptance; and $B_{r_r}$ is the magnitude of a susceptance connected to the load end of the line to provide at the sending end a source susceptance that cancels the sending-end susceptance. Susceptances $B_{ss}$ and $B_{r_r}$ are related by the following equation:

$$B_{r_r}=B_{s_s}=Y_0 \cot \beta L \quad (6)$$

When Equation 6 is satisfied, the source susceptances appearing at each of the line terminals is the conjugate of Equation 6 and is:

$$B_{rs}=B_{s_r}=-Y_0 \cot \beta L \quad (7)$$

As a result, the susceptance connected at each end of the line is cancelled to cause a net susceptance of zero at each end of the line. Furthermore, each of the products $G_{r_s}G_{s_s}$ and $G_{s_r}G_{r_r}$ must be greater than either $B_{ss}$ or $B_{r_r}$, in order for the characteristic admittance $Y_0$ to have a real value.

The length of the transmission line is related to the characteristic admittance as follows:

$$L=\frac{\lambda}{2\pi}\cot^{-1}\left(\frac{G_{s_r}G_{r_r}-Y_0^2}{Y_0}\right)=\frac{\lambda}{2\pi}\cot^{-1}\left(\frac{G_{r_s}G_{s_s}-Y_0^2}{Y_0}\right) \quad (8)$$

where L is the length of the transmission line between the receiving and sending terminals, and $\lambda$ is the wavelength in the line of propagated energy at the chosen frequency. Consequently, it will be desirable, in some cases to make connector 27 slideable to provide line 33 with an adjustable length.

In regard to the invention shown in Figures 1 and 2, the first adjustment is of neutralizing stub 46, which is resonated with the grid-to-plate capacitance of tube 12 at a desired operating frequency for the amplifier, which might be 1000 megacycles, for example.

In regard to first transmission line 33, in Figures 1 and 2, stubs 37 and 41 are then adjusted so that there is zero net susceptance at opposite ends of line 33 at the amplifier operating frequency. This is done by positioning slugs 38 and 43 along their respective stubs. Thus, the input susceptance of tube 12 is cancelled, and any susceptance provided at connector 27, due to its connection to a lead-in line such as one connected to an antenna 32, is cancelled. Hence, pure conductances result at opposite ends of transmission line 33.

It follows then with transmission line 33 that: $G_{r_r}$ is actually the input conductance, $G_{in}$, of tube 12; and $G_{r_s}$ is the apparent-source conductance, $G_a$, at the input to tube 12.

After the selection of a particular tube 12 is determined by the product, $G_tR_{eq}$, the optimum mismatch ratio $G_a/G_{in}$ may be determined with the use of Figure 3, and the following may be stated:

$$\text{Mismatch Ratio}=\frac{G_a}{G_{in}}=\frac{G_{r_s}}{G_{r_r}}=\frac{G_{s_r}}{G_{s_s}} \quad (9)$$

The dimensions for transmission line 33 and its connecting stubs 37 and 41 may be determined from the value of characteristic admittance found using Formula 5 above.

The use of strip-type transmission line permits the characteristic admittance, $Y_0$, to be controlled and varied with relative ease. The value of $Y_0$ may be controlled by adjusting the width of the single ungrounded strip, or by adjusting the spacing between it and the ground-plane, or by providing and controlling the dielectric material between the strip and the ground plane. In any case, final adjustment of characteristic-admittance can easily be made by adjusting the spacing between the strip and the ground-plane.

The stubs can conveniently have the same characteristic impedance as the transmission line to which they connect.

Transmission line 67, which connects the output of grounded-cathode tube 12 to the input of grounded-grid tube 61, may be proportioned using the same principles as described above for first transmission line 33.

Stubs 71 and 76 are provided at the opposite ends of second line 67 to provide source susceptances that cancel the susceptances which may be provided by the tubes. Hence, the mismatching theorem stated above applies.

The mismatching impedance ratio for second transmission line 67 may be determined by the value of mismatch required at the input to grounded-grid tube 61 to provide it with an optimum noise-figure. Obtaining the proper mismatch for second tube 61 is not as critical as obtaining a proper mismatch for first tube 12, since the former has much less effect upon the overall noise figure of the two-stage amplifier. Also, the choice of mismatch ratio for second transmission line 67 is influenced by stability considerations for first tube 12. Generally speaking, the stability of the first tube increases as the ratio of its plate impedance to plate-load impedance increases, i. e., as its apparent-plate-load impedance becomes smaller.

Therefore, a mismatching ratio $G_{s_r}/G_{s_s}$ is required: wherein $G_{ss}$ is the plate conductance looking into the tube; and $G_{s_r}$ is the plate-load conductance, which is determined by looking from the plate into transmission line 67.

The considerations for determining the input-mismatching ratio $G_a/G_{in}$ to a grounded-grid amplifier are not the same as those used for determining the input-mismatching ratio of a grounded-cathode amplifier because of the difference in input conductance $G_{in}$. Figure 3 can also be used to determine the optimum mismatching ratio $G_a/G_{in}$ for a grounded-grid amplifier but the procedure is less direct than for the grounded-cathode amplifier. Thus, the ratio $$\left(\frac{G_a}{G_t}\right)_{\text{opt.}}$$

determined by Equation 3 above, and which is approximately the input mismatch ratio of a grounded-cathode amplifier, can only indirectly provide the optimum mismatch ratio for a grounded-grid amplifier. This may be done with the following formula:

$$\left(\frac{G_a}{G_{in}}\right)_{\substack{\text{opt.}\\ \text{G.G.}}}=\frac{G_a\left(1+\frac{R_p}{r_p}\right)\left(\frac{G_a}{G_t}\right)_{\text{opt.}}}{G_a\left(1+\frac{R_p}{r_p}\right)+g_m\left(\frac{G_a}{G_t}\right)_{\text{opt.}}} \quad (10)$$

Often, the optimum-mismatching ratio for a grounded-grid amplifier requires the apparent-source conductance to be smaller than the input-conductance, which is a reversed situation from the grounded-cathode case. The mismatching ratio required at the input to grounded-grid tube 61 can be determined accordingly.

Generally, a compromise is required between gain considerations for first tube 12 and its stability. This compromise depends, in part, upon the characteristics of the particular tubes chosen for both stages. Often, the compromise is resolved when the mismatching-impedance ratio required at the input to grounded-grid tube 61 for best noise-figure provides an optimum-plate impedance ratio for the grounded-cathode tube 12 to provide the best compromise of stability and gain.

Consequently, Formulas 4, 5 and 9 may be applied when the desired mismatch ratio for the particular tubes is found. Thus, the characteristic admittance of second transmission line 67 may be calculated using Formula 5 above, and the size of strip 68 and its spacing from the top of grounded shield 70 determined accordingly. A final adjustment of characteristic admittance may be obtained by adjusting the spacing between strip 68 and shield 70.

The third transmission line 81 is used to connect the output of grounded-grid tube 61 to an ultimate load, which might, for example, be a mixer stage. Generally, maximum power considerations will prevail in determining the transmission-line characteristics of line 81, since the amplifier will often provide sufficient gain to make the noises generated in the following stages negligible. Where, however, the noise considerations of the following stage are very important, which may be important with certain types of mixers, then transmission line 81 should be mismatched in the same manner as previously discussed.

The output impedance at connector 86 may be controlled over a wide range by making connector 86 slideable along the length of transmission line 82. Thus, an impedance match may then be obtained between connector 86 and an outgoing transmission line (not shown) by adjusting the length of line 82 and the position of slug 88.

Stub 89 is used to control the susceptance which may exist in the amplifier output.

It is, therefore, apparent that this invention provides an amplifier which obtains a very low noise-figure in the ultra-high frequency region. Furthermore, it can be seen that this invention also provides a U. H. F. amplifier which is capable of having a high input impedance, and, accordingly, is capable of having a narrow-band input. It is further noted that the adjustments required in the invention are relatively simple, mechanically speaking, and have a given order which permits variable tuning over a range of ultra-high frequencies with good stability.

While a particular form of the invention has been shown and described, it will be obvious to a person skilled in this particular art after studying this specification, that this invention is capable of many modifications. Many changes, therefore, in the construction and arrangement of this invention may be made without departing from its full scope as given by the appended claims.

What is claimed is:

1. A stable low-noise U. H. F. amplifier capable of having narrow-band selectivity comprising a flat ground-plane member of conducting material, a well-type tube support fastened to said ground member, a first electron tube supported in said well, the grid and plate of said first tube extending through an opening formed through said ground member, a coaxial input connector with its outer conductor connected to said ground member on the same side as said well and having its inner conductor passing through an opening formed in said ground member, a flat metallic conductor connected at one end to the grid of said first tube and connected at an intermediate point to the inner conductor of said input connector, a first metallic slug received between said ground member and the portion of said first metallic strip extending beyond said input connector oppositely from said first tube, a second metallic strip connected at one end to the grid of said first tube, a second metallic slug received between said second metallic strip and said ground-plane, a second electron tube extending through an opening formed in said ground member and having its grid connected radio-frequency-wise to said ground member with its cathode extending on the same side of said ground member as the plate of said first tube, a third metallic strip connected between the plate of said first tube and the cathode of said second tube, a fourth metallic strip connected at one end to the plate of said first tube, a third slug having low radio-frequency impedance supported between said fourth metallic strip and said ground member, a fifth metallic strip connected at one end to the cathode of said second tube, a fourth slug having low radio-frequency impedance connected between said fifth metallic strip and said ground member, an output coaxial connector having its outer conductor connected to said ground member with its inner conductor passing through an opening in said ground member, a sixth metallic strip connected at one end to the plate of said second tube and connected at an intermediate point to the inner conductor of said output connector, a fifth slug of conducting material received between said ground member and said sixth metallic strip on its portion extending beyond the output connector oppositely from said second tube, a neutralizing stub connected radio-frequency-wise between the plate and grid of said first tube to neutralize its plate-to-grid interelectrode capacitance, whereby the characteristic impedances and lengths of the strip-type transmission lines can be controlled to provide a minimum noise figure for the amplifier.

2. An amplifier as in claim 1 in which said fourth metallic strip is insulated direct-current-wise but is connected U. H. F.-wise from the plate of said first tube, said fifth metallic strip is insulated direct-current-wise but is connected U. H. F.-wise from the cathode of said second tube, said fifth slug providing direct-current insulation but not U. H. F. insulation between said sixth strip and said ground member, direct-current blocking means are incorporated into said neutralizing stub without substantially affecting U. H. F. conduction, the grid of said second tube is insulated direct-current-wise from said ground member but connected U. H. F.-wise, a plate-voltage supply is connected to said sixth metallic strip, a voltage divider is connected between said plate-voltage supply and said ground member, an intermediate point on said divider is connected to the grid of said second tube to properly bias it, and a resistor is connected between said ground member and the cathode of said first tube to properly bias it.

3. A stable low-noise U. H. F. amplifier comprising a ground-potential member, an electron tube supported by said ground-potential member, an input transmission line connected at one end to the grid and cathode of said tube, a pair of susceptance-cancelling stubs connected respectively to the opposite ends of said input transmission line, a load connected between said ground potential member and the plate of said tube, the ratio $$\left(\frac{G_a}{G_t}\right)_{\text{opt.}}$$

being the optimum mismatching ratio for said tube, and the length (L) of said input line being approximately determined by the expression $$L=\frac{\lambda}{2\pi}\cot^{-1}\left[\frac{G_{s_r}G_t-Y_0^2}{Y_0}\right]$$

where $Y_0$ is the characteristic impedance of said input line, $G_{s_r}$ is the conductance of said input transmission line, and $G_t$ is the input conductance of said tube, and $\lambda$ is a chosen U. H. F. wavelength.

4. A U. H. F. amplifier as defined by claim 3 in which said input transmission line, second transmission line, and stubs each comprise, a strip of conducting material supported substantially parallel to said ground-potential member.

5. A stable low-noise U. H. F. amplifier comprising a ground-potential member, first and second electron tubes supported by said ground-potential member, said first tube connected in a grounded-cathode manner, and said second tube connected in a grounded-grid manner, an input transmission line connected at one end to the grid and cathode of said first tube, a pair of susceptance-cancelling stubs connected respectively to the opposite ends of said input line, a second transmission line connected at one end to the plate and cathode of said first tube, and connected at the other end to the ground-potential member and the cathode of said second tube, a second pair of susceptance-cancelling stubs connected respectively to the opposite ends of said second transmission line, the ratio $$\left(\frac{G_{a_1}}{G_{in_1}}\right)_{\text{opt.}}$$

being the optimum mismatching ratio for said first tube, and the ratio $$\left(\frac{G_{a_2}}{G_{in_2}}\right)_{\text{opt.}}$$

being the optimum mismatching ratio for said second tube, wherein $G_{in}$ is the input conductance of either tube and $G_a$ is the source conductance at the tube input, and the length of each of said transmission lines being approximately determined by the expression:

$$L=\frac{\lambda}{2\pi}\cot^{-1}\left[\frac{G_{in}^2\left(\frac{G_a}{G_{in}}\right)_{\text{opt.}}-Y_0^2}{Y_0}\right]$$

where $Y_0$ is the characteristic admittance of the line, and $\lambda$ is a chosen U. H. F. wavelength.

6. A U. H. F. amplifier as defined in claim 5 in which said input and second transmission lines each comprise, a strip of conducting material supported parallel to said ground-potential member, and each of said stubs comprises, a strip of conducting material supported parallel to said ground-potential member, and adjustable-shorting means positioned between the strip and ground member, and a neutralizing stub connected between the grid and plate of said first tube.

7. A stable low-noise amplifier for operation at ultra-high frequencies comprising a ground-potential member, an electron discharge tube supported by said ground-potential member and having its cathode connected radio-frequency-wise to said member, an input transmission line, comprising said ground member, and a conducting strip fastened at one end to the grid of said first tube, a pair of susceptance-controlling stub means connected respectively to the ends of said input line for cancelling the net susceptance at opposite ends of said input line, said input line having its characteristic admittance $Y_0$ defined as $$Y_0=\sqrt{G_{r_s}G_{s_s}-B_{r_r}^2}=\sqrt{G_{s_r}G_{r_r}-B_{s_s}^2}$$

where $G_{r_s}$ is the source conductance at the input to said tube, $G_{ss}$ is the conductance connected at the sending end of said input line, $B_{r_r}$ is the susceptance of the stub connected to the tube end of said input line, $G_{s_r}$ is the conductance at the input to said input line, $G_{r_r}$ is the input conductance of said tube, and $B_{ss}$ is the susceptance of the stub connected to the sending end of said input line, and the following expression being approximately satisfied:

$$\frac{G_{r_s}}{G_{r_r}}=\frac{G_{s_r}}{G_{s_s}}=\frac{1}{\sqrt{5G_tR_{eq}}}$$

where $G_t$ is the transit-time loading conductance of said tube, and $R_{eq}$ is the equivalent noise resistance of said tube, a neutralizing stub connected between the grid and plate of said tube to resonate with its grid-to-plate interelectrode capacity, and the output of said tube removed between its plate and said ground-potential member.

8. Transmission-line means for providing a conductance mismatch $$\frac{G_{r_s}}{G_{r_r}}$$

at the receiving end of said line, with conductance $G_{r_r}$ provided by the receiving end, and conductance $G_{r_s}$ connected to the receiving end, comprising a ground member, a strip of metallic material supported from said ground member and insulated therefrom, a first stub connected to the sending end of said transmission line, a second stub connected to the receiving end of said line, shorting means with each of said stubs to cancel the susceptance at opposite ends of said transmission line, the susceptance defined by the expression:

$$Y_0\cot\beta L$$

where $Y_0$ is the characteristic admittance of said line, $\beta$ is the propagation constant of said line, and L is the length of said line between said stubs, and the length of said line being approximately defined by the quantity:

$$\frac{\lambda}{2\pi}\cot^{-1}\left(\frac{G_{s_r}G_{r_r}-Y_0^2}{Y_0}\right)$$

where $G_{s_r}$ is the conductance connected to the sending end of said line.

9. Means for providing at the sending and receiving terminals of a transmission line a required conductance mismatch which may be defined by the expression:

$$\text{conductance mismatch ratio}=G_{r_s}/G_{r_r}=G_{s_r}/G_{s_s}$$

wherein $G_{r_r}$ is the conductance connected to the receiving end of the line, $G_{r_s}$ is the line conductance provided at the receiving end, $G_{ss}$ is the conductance connected to the sending end of the line, $G_{s_r}$ is the line conductance provided at the sending end, comprising a first segment of transmission line connected to said sending terminals, a second segment of transmission line connected to said receiving terminals, respective short-circuiting members received in each of said segments to provide a cancelling-susceptance $B_L$ at opposite ends of said transmission line approximately defined by the expression:

$$B_L=Y_0\cot\beta L$$

where $Y_0$ is the characteristic admittance of said transmission line, $\beta$ is the propagation constant of said line, L is the length of said line, and said characteristic admittance is further approximately defined as:

$$Y_0=\sqrt{G_{s_r}G_{r_r}-B_L^2}=\sqrt{G_{s_s}G_{r_s}-B_L^2}$$

10. Means for providing a required conductance mismatch at opposite terminals of a strip-type transmission line utilized in ultra-high-frequency low-noise amplifiers, comprising a ground-potential member, a flat metallic-conducting strip supported substantially parallel to said ground member and insulated therefrom, said strip providing said transmission line with a characteristic admittance $Y_0$ and a length L, a second strip of conducting material connected at one end to an end of said first strip and spaced similarly from said ground member, first slug means received between said second strip and said ground member to provide a large U. H. F. conductance between said second strip and said ground member, a third flat metallic strip having one end connected to the opposite end of said first strip and similarly spaced from said ground member, second slug means supported between said third strip and said ground member to provide a large U. H. F. conductance between said third strip and said ground member, each of said slug means positioned to provide substantially zero net susceptance at said opposite terminals of said transmission line, and the characteristic impedance $Y_0$, and length L of said transmission line being approximately defined by:

$$L=\frac{\lambda}{2\pi}\cot^{-1}\left(\frac{G_{s_r}G_{r_r}-Y_0^2}{Y_0}\right)=\frac{\lambda}{2\pi}\cot^{-1}\left(\frac{G_{r_s}G_{s_s}-Y_0^2}{Y_0}\right)$$

where $\lambda$ is the U. H. F. wavelength, $G_{s_r}$ and $G_{r_r}$ are the respective line and terminal conductances at one end of the line, $G_{s_r}$ and $G_{ss}$ are the respective line and terminal conductances at the opposite end of the line, and the respective conductance mismatches at opposite ends of the line are defined as:

$$\frac{G_{r_s}}{G_{r_r}}=\frac{G_{s_r}}{G_{s_s}}$$

11. A stable low-noise U. H. F. amplifier comprising a ground-plane member, a pair of electron tubes supported by said ground-plane member and each including a cathode, a grid and a plate, the first tube having its cathode connected ultra-high-frequency-wise to said ground-plane, the second tube having its grid connected ultra-high-frequency-wise to said ground-plane, a neutralizing stub connected between the grid and plate of said first tube, first conducting means connected at one end to the grid of said first tube, an input-transmission line being comprised of said first conducting means and said ground-plane member, a first pair of stubs connected respectively to the opposite ends of said input-transmission line, said stubs cancelling the reactance at opposite ends of said input line, a second conducting means connected between the plate of said first tube and the cathode of said second tube, an intermediate-transmission line being comprised of said second conducting means and said ground-plane, a second pair of stubs connected respectively to opposite ends of said intermediate line, said second pair of stubs cancelling the net reactance at opposite ends of said intermediate line, the characteristic conductance $Y_0$, and length L of each of said lines being related to the conductances $G_{s_r}$ and $G_{r_s}$ looking into the opposite ends of the line, and the respective conductances $G_{s_s}$ and $G_{r_r}$ connected to the respective ends of the line at an operating wavelength λ as follows:

$$L=\frac{\lambda}{2\pi}\cot^{-1}\left(\frac{G_{s_r}G_{r_r}-Y_0^2}{Y_0}\right)=\frac{\lambda}{2\pi}\cot^{-1}\left(\frac{G_{r_s}G_{s_s}-Y_0^2}{Y_0}\right)$$

the ratio $G_{r_s}/G_{r_r}$ presented to each of said tubes being approximately their optimum mismatch ratio, and the output of said amplifier being provided from the plate of said second tube.

12. A stable low-noise U. H. F. amplifier capable of having narrow-band selectivity comprising a ground-potential member, a first electron tube supported by said ground member with its cathode connected radio-frequency-wise to said ground member, a first flat metallic transmission strip supported substantially parallel to said ground-member and connected at one end to the grid of said first tube, an input transmission line being comprised of said first transmission strip and said ground member, a first stub connected to one end of said input transmission line to provide a source susceptance at the opposite end of said input line that substantially cancels the net susceptance at the opposite end, a second stub connected to the opposite end of said input transmission line to provide a source susceptance at the first end that substantially cancels the net susceptance at the first end, a second electron tube supported by said ground-member with its grid connected radio-frequency-wise to said ground member, a second flat metallic strip supported substantially parallel to said ground member and connected at one end to the plate of said first tube and connected at its other end to the cathode of said second tube, a second transmission line comprised of said second strip and said ground member, a third stub connected between the ground member and plate of said first tube to substantially cancel the net susceptance at the input to said second tube, a fourth stub connected between the cathode of said second tube and the ground member to substantially cancel the net susceptance at the output of said first tube, a third flat metallic strip supported substantially parallel to said ground member and connected at one end to the plate of said second tube, an output transmission line being provided by said ground-plane and said third strip, a neutralizing stub connected radio-frequency-wise between the grid and plate of said first tube to neutralize its grid-to-plate interelectrode capacitance, the characteristic admittance $Y_0$ of each of said lines being dependent upon the widths of said strips and the dielectric-spacing between them and said ground member, $$\left(\frac{G_{r_{s1}}}{G_{r_{r1}}}\right)_{\text{opt.}}\text{ and }\left(\frac{G_{r_{s2}}}{G_{r_{r2}}}\right)_{\text{opt.}}$$

being the optimum conductance-mismatching ratios at the respective inputs to said first and second tubes, said ratios providing the maximum signal-to-noise ratio of said amplifier, where $G_{r_r}$ is the input conductance of the respective tube, and $G_{r_s}$ is the conductance of the line appearing to the respective tube input, the length of each of said lines being:

$$L=\frac{\lambda}{2\pi}\cot^{-1}\left(\frac{G_{s_r}G_{r_r}-Y_0^2}{Y_0}\right)$$

where $G_{s_r}$ is the conductance looking into the input of the respective line, and λ is the operating wavelength.

13. An amplifier as defined in claim 7, and including a second electron tube supported by said ground-potential member, the grid of said second tube connected radio-frequency-wise to said ground-potential member, an intermediate-transmission line, comprising said ground-potential member, and a second conducting strip connected at one end to the plate of said first tube and connected at its other end to the cathode of said second tube, a second pair of susceptance-controlling stub means connected respectively to the opposite ends of said intermediate-transmission line to substantially cancel the net susceptance at opposite ends of said intermediate line, said intermediate-transmission line approximately satisfying the formula:

$$\overline{Y}_0=\sqrt{\overline{G}_{r_s}\overline{G}_{s_s}-\overline{B}_{r_r}^2}=\sqrt{\overline{G}_{s_r}\overline{G}_{r_r}-\overline{B}_{s_s}^2}$$

where $\overline{Y}_0$ is the characteristic admittance of said intermediate-transmission line, $\overline{G}_{r_s}$ is the source conductance at the input to said second tube, $\overline{G}_{s_s}$ is the plate conductance of the first tube, $\overline{B}_{r_r}$ is the susceptance of the stub connected to the input to the second tube, $\overline{G}_{s_r}$ is the conductance at the input to said intermediate line, $\overline{G}_{r_r}$ is the input conductance of said second tube, and $\overline{B}_{s_s}$ is the susceptance of the stub connected to the output of said first tube, and the optimum input-impedance ratio of said second tube being $$\frac{\overline{G}_{r_s}}{\overline{G}_{r_r}}=\frac{\overline{G}_{s_r}}{\overline{G}_{s_s}}=\frac{\overline{G}_{r_s}\left(1+\frac{R_p}{r_p}\right)\sqrt{\frac{1}{5G_tR_{eq}}}}{\overline{G}_{r_s}\left(1+\frac{R_p}{r_p}\right)+g_m\sqrt{\frac{1}{5G_tR_{eq}}}}$$

where $R_p$ is the load resistance of said second tube, $r_p$ is its plate resistance, $g_m$ is its transconductance, $G_t$ is its transit-time loading conductance, and $R_{eq}$ is the equivalent noise resistance of the second tube.

References Cited in the file of this patent

UNITED STATES PATENTS

| | | |
|---|---|---|
| 2,143,671 | Zottu | Jan. 10, 1939 |
| 2,419,985 | Brown | May 6, 1947 |
| 2,524,821 | Montgomery | Oct. 10, 1950 |
| 2,615,998 | Charchian | Oct. 28, 1952 |